United States Patent [19]

Nelson et al.

[11] Patent Number: 4,825,251
[45] Date of Patent: Apr. 25, 1989

[54] IMAGING PROCESS INVOLVING HARDENING OF IMAGING WEB BORDER AREA PHOTOSENSITIVE MICROCAPSULES AND AN APPARATUS USEFUL THEREIN

[75] Inventors: Erik K. Nelson; Michael E. Demarchi, both of Centerville; David A. Boyer, Miamisburg, all of Ohio

[73] Assignee: The Mead Corporation, Dayton, Ohio

[21] Appl. No.: 218,773

[22] Filed: Jul. 14, 1988

Related U.S. Application Data

[62] Division of Ser. No. 52,317, May 19, 1987, Pat. No. 4,770,972.

[51] Int. Cl.⁴ .................. G03B 27/32; G03B 27/52
[52] U.S. Cl. ................................ 355/27; 355/74; 355/125
[58] Field of Search ................ 430/138; 355/27, 74, 355/125

[56] References Cited

U.S. PATENT DOCUMENTS

| | | | |
|---|---|---|---|
| 2,524,941 | 10/1950 | Taylor | 355/125.4 |
| 4,073,968 | 0/0000 | Miyamoto et al. | 427/54 |
| 4,108,548 | 8/1978 | Hawkins | 355/74 |
| 4,399,209 | 0/0000 | Sanders et al. | 430/138 |
| 4,440,846 | 0/0000 | Sanders et al. | 430/138 |
| 4,457,620 | 7/1984 | Kostiner | 355/74 |
| 4,613,742 | 0/0000 | Nelson et al. | 219/121 LG |

OTHER PUBLICATIONS

Supercalendering-1980 Update, J. David Pfeiffer, pp. 19-31 (undated).
Application of Rubber Covered Rolls to Pinch Rolls and Bridles, Iron and Steel Engineer Year Book, 1964, A. R. Foreman, pp. 646-655.

*Primary Examiner*—Richard A. Wintercorn
*Attorney, Agent, or Firm*—Biebel, French & Nauman

[57] ABSTRACT

The present invention provides an imaging process wherein the pressure application developer means is not contaminated during pressure development. The process involves an imaging web including a support having a layer on the surface thereof of photosensitive microcapsules including an internal phase of a photohardenable photosensitive composition and a color former. The imaging web is image-wise exposed to a first source of actinic radiation to form an image area; this exposure defines a border area in the web comprising the areas of the imaging web surrounding the image area. The image area of the imaging web is contacted with an opaque receiver sheet. The border area is then uniformly exposed to a second source of actinic radiation to harden the microcapsules in the border area. The entire surface of the imaging sheet is then subjected to a uniform rupturing force such that the microcapsules rupture and release the internal phase in accordance with the image-wise exposure to react with the developer material associated with the imaging sheet or the receiver sheet to produce an image.

12 Claims, 2 Drawing Sheets

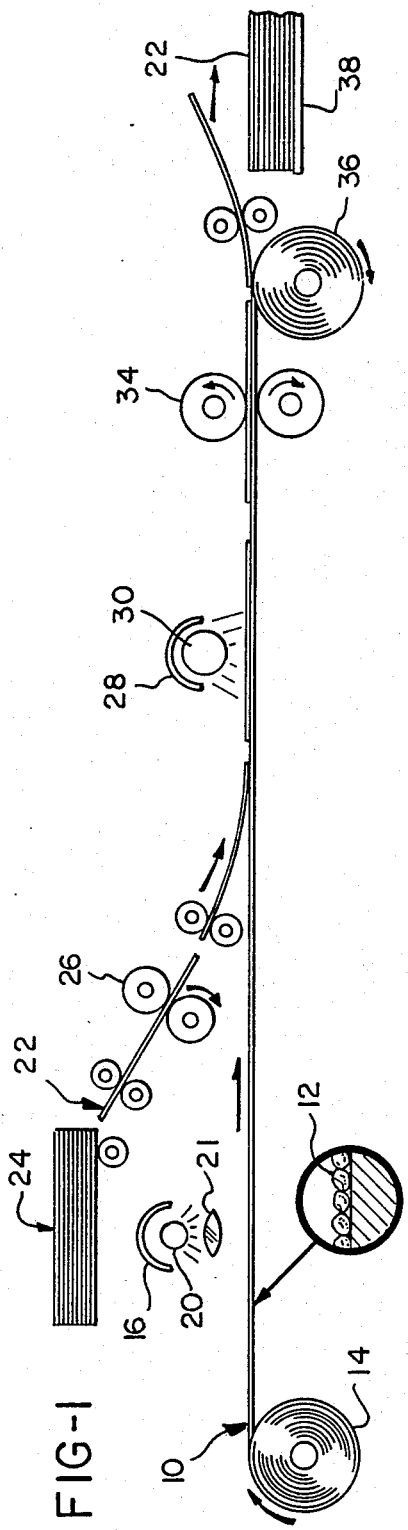
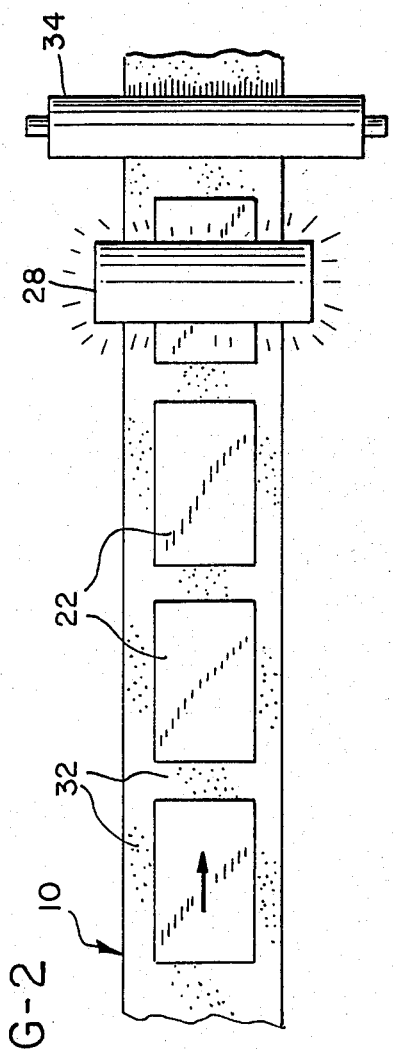

IMAGING PROCESS INVOLVING HARDENING OF IMAGING WEB BORDER AREA PHOTOSENSITIVE MICROCAPSULES AND AN APPARATUS USEFUL THEREIN

This is a division of application Ser. No. 052,317 filed May 19, 1987 now U.S. Pat. No. 4,770,972.

BACKGROUND OF THE INVENTION

The present invention relates to an imaging process involving hardening of the photosensitive microcapsules in the border area of an imaging web.

Photosensitive materials have been used in many applications including imaging systems. For example, commonly assigned U.S. Pat. Nos. 4,399,209 and 4,440,846 disclose imaging systems wherein the imaging sheet comprises a support with a layer of microcapsules on the surface thereof. The microcapsules have an internal phase of a photohardenable photosensitive composition and a color former. The microcapsules are image-wise exposed to actinic radiation and ruptured so that the color former reacts with a developer material to produce an image.

In the transfer imaging system of U.S. Pat. No. 4,399,209, the imaging sheet is contacted with a receiver sheet comprising a developer sheet having a support with a layer of developer material on the surface thereof prior to microcapsule rupture. In the self-contained imaging system of U.S. Pat. No. 4,440,846, the imaging sheet has developer material codeposited with the microcapsules on the surface thereof.

The imaging sheet of the aforementioned imaging systems is commonly in the form of a web and the receiver sheets are in the form of single sheets. Because the imaging web is typically slightly wider than the width of the receiver sheets placed thereon, and because the receiver sheets are placed on the imaging web with gaps existing between the ends of neighboring receiver sheets so that registration is practical, each receiver sheet is "framed" by an uncovered portion of the imaging web. Upon passage of the imaging web with receiver sheets thereon through the nip between two pressure rollers to rupture the microcapsules for image development, the internal phase of the ruptured microcapsules on the uncovered portion of the imaging web collects on the surface of the pressure rollers. In addition to contaminating the rollers, the internal phase on the rollers can be transferred to other surfaces such as to other areas of the development apparatus or to the backs of subsequent receiver sheets passing through the pressure rollers. Receiver sheets having soiled backs are undesirable Also, cleaning the contaminated pressure rollers and related fixtures is time consuming and expensive.

Also, another problem thought to be unrelated, exists with pressure development of the aforementioned imaging web. An imaging web having a support of a polymeric film cannot be transported successfully through high pressure nip rollers because the imaging web will often deform.

U.S. Pat. No. 4,073,968 teaches a method of desensitization of a color developer sheet in areas which are usually not used for recording. To make the desensitized areas, the method involves coating a photocurable compound onto a layer of microencapsulated color former coated on paper, curing the compound, and coating the outer surface of the compound with a layer of developer material. By this method, the layer of color former and the layer of developer material are physically separated by the cured film to prevent color formation. A pressure is then applied to the assembly to form a color. In the desensitized areas, a color reaction does not occur. Because the microcapsule internal phase of color former in solvent can still be released during microcapsule rupture and collect on the surface of the pressure rollers, the method of U.S. Pat. No. 4,073,968 does not overcome the aforementioned contaminated pressure roller problem.

Thus, a need exists in the art for an imaging process and apparatus useful therein in which the uncovered portions of an imaging web do not contaminate the pressure rollers during pressure development.

DEFINITIONS

The term "harden" as used herein refers to gelling or otherwise solidifying the internal phase of the microcapsules.

The term "image-wise" as used herein means that upon exposure and transfer, the color former and the developer material react to form a positive or negative image of the original.

The term "microcapsules" as used herein refers to microcapsules having a discrete microcapsule wall.

The term "photohardenable composition" as used herein means a composition which becomes more viscous upon exposure to actinic radiation.

The term "opaque" as used herein to describe receiver sheet means a receiver sheet which is opaque to at least one wavelength of light. In other words, the receiver sheet can be transparent to other wavelengths of light as long as the receiver sheet is opaque to at least one wavelength.

SUMMARY OF THE INVENTION

The present invention provides an imaging process involving an imaging web including a support having a layer on the surface thereof of photosensitive microcapsules including an internal phase of a photohardenable photosensitive composition and a color former. The imaging web is image-wise exposed to actinic radiation to form an image area; this exposure defines a border area in the web comprising the areas of the imaging web surrounding the image area. The image area of the imaging web is contacted with an opaque receiver sheet.

The border area of the imaging web is then uniformly exposed to actinic radiation to harden the microcapsules in the border area. The entire surface of the imaging sheet is then subjected to a uniform rupturing force such that the microcapsules rupture and release the internal phase in accordance with the image-wise exposure to react with a developer material associated with the imaging sheet or the receiver sheet to produce an image.

By exposing the border microcapsules to actinic radiation to harden the internal phase prior to pressure development, the process of the present invention fulfills the need in the art for a process wherein the uncovered portions of an imaging web do not contaminate the pressure rollers during pressure development. The imaging web with hardened border microcapsules passes through the pressure application developer means without depositing any contaminates thereon, and as such, no contamination is transferred to other surfaces such as related pressure development fixtures and backs of subsequent receiver sheets. Also, the time and expense involved in cleaning the contaminated pressure application developer means have been eliminated by the present invention.

In addition to eliminating the foregoing contamination problem, the present invention has provided an unexpected result. As discussed earlier, an imaging web having a support of a polymeric film has not previously been transported successfully through high pressure nip rollers because the imaging web did not track properly and became misaligned or deformed. The prior practice has been to open and close the nip rollers to re-align the imaging web if long rolls of imaging web were to be successfully transported.

Also, a 1-mil uncoated polymeric web passing through a developer previously has failed almost immediately due to wrinkling. It is believed that sideways deformation of the web caused by the POISSIONS deflection of the material caused the failure. It had been found that cushioning the uncoated web with another substrate while passing through the developer prevented web destruction.

Exposing the border microcapsules in accordance with the present invention to eliminate the contamination of the pressure application means yielded the unexpected results that the web properly tracks through the nip and wrinkling is eliminated. Hardening the border microcapsules of the coated web prior to pressure development causes the coated web to behave in a manner similar to that of combining the uncoated web with another substrate prior to pressure development. It is believed that exposing the border microcapsules, which changes the viscosity of the internal phase, allows the imaging web to feed through the pressure application means with a "cushion" which allows local deflection of the web to be absorbed by the microcapsules. Prior to the present invention, this result had never been achieved with an imaging web having a support of a polymeric film. Thus, the present invention provides the unexpected result of complete web handling capability.

The present invention also provides an apparatus useful in the foregoing imaging process. The apparatus is useful for exposing and developing an imaging web having an image area and a border area, wherein the web includes a support having a layer on the surface thereof of photosensitive microcapsules including an internal phase of a photohardenable photosensitive composition and a color former. The apparatus comprises: a source of actinic radiation for exposing the border area of the imaging web to harden the photosensitive microcapsules; means for preventing the source of actinic radiation from exposing the image area of the imaging web; and pressure application developer means.

In accordance with another embodiment, the present invention also provides an imaging process involving an imaging web including a support having a layer on the surface thereof of photosensitive microcapsules including an internal phase of a photohardenable photosensitive composition and a color former. The imaging web is image-wise exposed to a first source of actinic radiation to form an image area; this exposure defines a border area in the web comprising the areas of the imaging web surrounding the image area.

Simultaneously with the image-wise exposure, the border area of the imaging web is uniformly exposed to actinic radiation to harden the microcapsules in the border area. The entire surface of the imaging sheet is subjected to a uniform rupturing force such that the microcapsules rupture and release the internal phase in accordance with the image-wise exposure to react with a developer material to produce an image.

The present invention also provides an apparatus useful in the foregoing imaging process. The apparatus is useful for exposing and developing an imaging web wherein the web includes a support having a layer on the surface thereof of photosensitive microcapsules including an internal phase of a photohardenable photosensitive composition and a color former. The apparatus comprises: a first source of actinic radiation for image-wise exposure of the photosensitive microcapsules of the imaging web such that an image area is formed, the exposure defining a border area in the imaging web comprising the areas of the imaging web surrounding the image area; a second source of actinic radiation for uniform exposure of the border area of the imaging web to harden the microcapsules; means for preventing the second source of actinic radiation from exposing the image area of the imaging web; and pressure application developer means.

Thus, an object of the present invention is to provide an imaging process and apparatus useful therein whereby the foregoing pressure application developer means contamination problem is eliminated.

A more particular object of the present invention is to provide an imaging process and apparatus useful therein whereby border microcapsules are hardened prior to pressure development.

An additional object of the present invention is to provide an imaging process and apparatus useful therein wherein the unexpected result of complete web handling capability is achieved.

Other objects and advantages of the present invention will become apparent from the following description, attached drawings, and appended claims.

BRIEF DESCRIPTION OF THE DRAWINGS

FIG. 1 is a schematic side illustration of one imaging process and an apparatus useful therein in accordance with the present invention FIG. 2 is a top view of the second exposure station of FIG. 1.

DETAILED DESCRIPTION OF THE INVENTION

Figure 3:
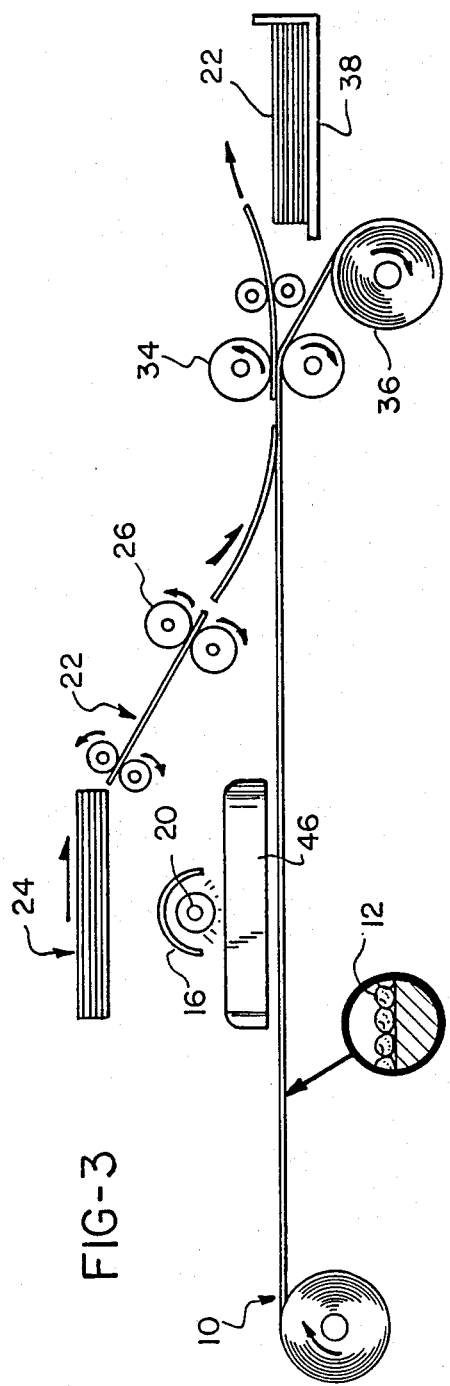
FIG. 3 is a schematic side view of another imaging process and an apparatus useful therein in accordance with the present invention.

FIG. 1 is a schematic illustration of one embodiment of the present invention. An imaging web 10 carrying a layer 12 of photohardenable photosensitive microcapsules on the upper surface thereof is supplied from supply roll 14. Useful web materials, encapsulation techniques, and color formers are disclosed in commonly assigned U.S. Pat. Nos. 4,399,209 and 4,440,846 which are incorporated herein by reference. Preferred photosensitive compositions are disclosed in commonly assigned U.S. application Ser. No. 917,873, filed Oct. 10, 1986. Preferred photoinitiators are disclosed in commonly assigned U.S. application Ser. No. 944,305, filed Dec. 18, 1986.

The imaging web 10 is conveyed to an exposure station 16. When one frame or picture unit is positioned at the exposure station 16, it is image-wise exposed to a first source of actinic radiation 20 to form an image area on the imaging web 10. Preferably, the exposure is focused through lens 21. Typically, a photomask (not shown) or other means is used to provide the image information for exposure. This exposure defines a border area in the web comprising the areas of the imaging web 10 surrounding the image area. Various forms of actinic radiation are useful in image-wise exposing the layer 12 of photohardenable photosensitive microcapsules including ultraviolet radiation, infrared radiation, visible light, x-ray, and ion beam irradiation. Of course, the form selected is dependent upon the specific photosensitive composition selected. Any source of actinic radiation which can provide one of the foregoing forms of actinic radiation is useful in the present invention. Preferably, the source of actinic radiation 20 provides broad band visible light. In FIG. 1, the source of actinic radiation 20 has been simplified for illustration purposes.

After the layer 12 of microcapsules has been exposed at exposure station 16, the imaging web 10 is advanced to a station where the imaging web 10 is assembled with an opaque receiver sheet 22. The opaque receiver sheets 22 may be developer sheets which carry a layer of developer material which can react with the color former released upon the rupture of the microcapsules to produce a colored image. Alternatively, the opaque receiver sheets 22 may be sheets of plain bond paper which receive the dye product of a color former and a developer material released from a self-contained imaging sheet Preferred developer resins are disclosed in commonly assigned U.S. application Ser. No. 905,727, filed Sept. 9, 1986.

In FIG. 1, opaque receiver sheets 22 are schematically illustrated as being fed from a stack 24. A variety of conventional sheet handling, conveying, and registration means can be used to feed the opaque receiver sheets 22 from the stack 24 into contact with the imaging web 10. In the illustrated embodiment, the opaque receiver sheet 22 is schematically shown as being fed into contact with the imaging web 10 via guide rollers 26.

The receiver sheets 22 are placed on the imaging web 10 to cover the image areas and gaps are allowed to exist between the ends of neighboring receiver sheets 22 so that registration is practical. The imaging web 10 is usually slightly wider than the width of the receiver sheets 22 placed thereon. Thus, each receiver sheet 22 is framed by a border area which comprises the area between the ends of neighboring receiver sheets 22 and also the area due to the difference in widths between the imaging web 10 and receiver sheets 22.

With the opaque receiver sheet 22 assembled with the imaging web 10, the two are passed beneath a second exposure station 28 and uniformly exposed to a second source of actinic radiation 30 to harden the microcapsules of the border area 32 of the imaging web 10 as shown in FIG. 2. The source of actinic radiation 30 exposes the entire width of imaging web 10 as it passes beneath the second exposure station 28. Although other useful means such as baffles exist, the means for preventing the second source of actinic radiation 30 from exposing the image area of the imaging web 10 are preferably the opaque receiver sheets 22 positioned in contact with the image area.

As those skilled in the art can appreciate, the photosensitive composition is sensitive to certain radiation which is the radiation used for the image-wise exposure and the border hardening. Accordingly, the receiver sheets 22 must be opaque, as defined earlier, to at least one wavelength of light which can harden the photosensitive composition of the border. Otherwise, if the receiver sheets 22 were transparent to all forms of radiation, the actinic radiation from source 30 would expose the image area through the receiver sheet. Thus, exposure at the appropriate wavelength by the second source of actinic radiation 30 hardens the microcapsules in the border areas 32 of imaging web 10 but does not affect the image areas of imaging web 10 which are covered by the opaque receiver sheets 22.

Comparable to the first source of actinic radiation 20, various forms of actinic radiation are useful in uniformly exposing the border area 32 including ultraviolet radiation, infrared radiation, visible light, X-ray, and ion beam irradiation. Of course, the form of actinic radiation selected is dependent upon the specific photosensitive composition selected. Any source of actinic radiation which can provide one of the foregoing forms of actinic radiation is useful in the present invention. Preferably, the source of actinic radiation 30 provides broad band visible light. In FIG. 1, the source of actinic radiation 30 has been simplified for illustration purposes.

The receiver sheets 22 assembled with the imaging web 10 are passed through a pressure application developer means 34 which subjects a uniform rupturing force on the entire surface of the imaging web 10 such that the microcapsules rupture and release the internal phase in accordance with the image-wise exposure to react with the developer material associated with the imaging web 10 or the opaque receiver sheet 22 to produce an image Useful pressure application developer means are disclosed in commonly assigned U.S. application Ser. No. 009,851, filed Feb. 2, 1987. Preferably, the pressure application developer means 34 is a pair of pressure rollers. The pressure rollers are designed to obtain an even lineal distribution of the pressure across the surface of the rollers. A preferred two-roll developer is disclosed in commonly assigned U.S. application Ser. No. 039,393, filed Apr. 16, 1987.

By previously hardening the microcapsules in the border area 32, the microcapsules do not release their internal phase upon passing through the pressure application developer means 34. Thus, as discussed earlier, the contamination problem of the pressure application developer means 34 has been eliminated by the present invention. Also, as discussed earlier, the unexpected result of complete web handling capability is achieved by the present invention.

After rupturing the microcapsules, the receiver sheet 22 is separated from the imaging web 10 and collected in tray 38. Again, conventional sheet handling means can be used for this purpose. The imaging web 10 is collected in a take-up roll 36.

This embodiment may be advantageous in that registration of the imaging web exposed border with the receiver sheet is not a problem. This is because the exposed border is formed only after the receiver sheet is positioned on the web. A borderless receiver sheet can also be used.

FIG. 3 is a schematic illustration of another embodiment of the present invention. An imaging web 10 carrying a layer 12 of photohardenable photosensitive microcapsules on the upper surface area thereof is supplied from supply roll 14. It should be understood that the materials disclosed for imaging web 10 in the first embodiment as illustrated in FIGS. 1 and 2 are useful in this embodiment.

Figure 4:
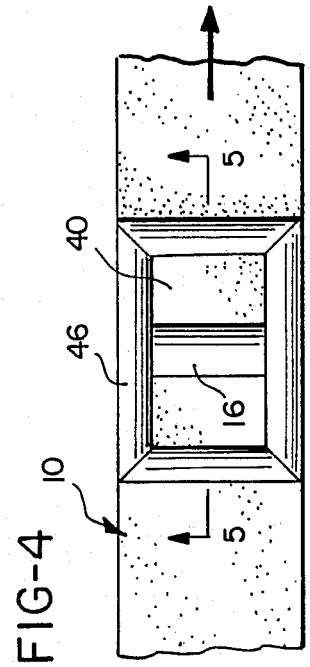
FIG. 4 is a top view of the exposure apparatus of FIG. 3.
Figure 5:
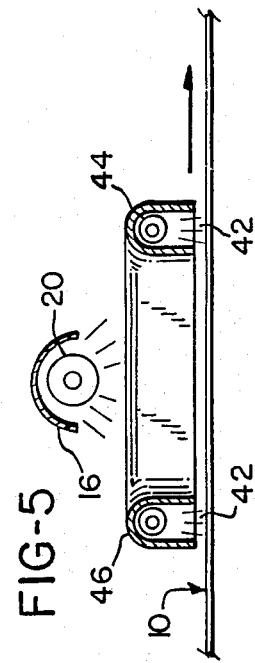
FIG. 5 is a cross-sectional view taken through the exposure apparatus of FIG. 4 along line 5—5.

The imaging web 10 is conveyed to an exposure station 16. One frame or picture unit is positioned at the exposure station 16. A first source of actinic radiation 20 at exposure station 16 image-wise exposes the imaging web 10 to form an image area 40 as shown in FIG. 4. Typically, although not illustrated, a photomask or other means is used to provide the image information for exposure, with the information focused onto the web through a lens or the like (not shown). This exposure defines a border area 42 in the web comprising the areas of the imaging web 10 surrounding image area 40. Simultaneously with the image-wise exposure, a second source of actinic radiation 44 as shown in FIG. 5 uniformly exposes the border area 42 of the imaging web 10 to harden the microcapsules in the border area 42.

A means 46 for preventing the second source of actinic radiation 44 from exposing the image area 40 of the imaging web 10 is placed over the border area 42. Although other useful means such as a receiver sheet positioned in contact with the image area exist, preferably, means 46 is a baffle having a U-shaped cross-section which is placed over the border area 42 with its open end adjacent thereto. A gap of about 0.076–0.152 cm (0.03–0.06 inch) exists between the baffle and the imaging web 10. The baffle prevents the second source of actinic radiation 44 which is disposed within the baffle from exposing the image area 40 of the imaging web 10. It should be understood that the baffle can cover part of the image area 40 such that upon pressure development, the final image has a white photographic border thereon. By using the baffle, a sharply exposed border edge is also achieved.

Various forms of actinic radiation are useful in image-wise exposing and uniformly exposing imaging web 10 including ultraviolet radiation, infrared radiation, visible light, X-ray, and ion beam irradiation. Again, the form of actinic radiation selected is dependent upon the specific photosensitive composition selected. Any source of actinic radiation which can provide one of the foregoing forms of actinic radiation is useful in the present invention. Preferably, the sources of actinic radiation 20 and 44 provide broad band visible light. The second source of actinic radiation 44 can be a custom cold cathode fluorescent lamp which is shaped to expose the border area 42. Because a stepping transport system is used, the exposure time is longer than in a continuous transport system. As such, a lower intensity radiation source can be used than in a continuous transport system.

After the layer 12 of microcapsules has been exposed at exposure station 16, the imaging web 10 is advanced to a station where the imaging web 10 is assembled with a receiver sheet 22. The receiver sheets 22 may be developer sheets which carry a layer of developer material which can react with a color former released upon the rupture of the microcapsules to produce a colored image. Alternatively, the receiver sheets 22 may be sheets of plain bond paper which receive the dye product of the color former and a developer material released from a self-contained imaging sheet. Preferred developer resins are disclosed in commonly assigned U.S. application Ser. No. 905,727, filed Sept. 9, 1986.

In FIG. 3, receiver sheets 22 are schematically illustrated as being fed from a stack 24. A variety of conventional sheet handling, conveying, and registration means can be used to feed the receiver sheets 22 from the stack 24 into contact with the imaging web 10. In the illustrated embodiment, the receiver sheet 22 is schematically shown as being fed into contact with the imaging web 10 via guide rollers 26.

The imaging process then proceeds in a fashion analogous to that illustrated in FIG. 1 with similar apparatus.

This embodiment may be advantageous since a stepping transport system is typically used within the exposure station so that the primary exposure is made with the web stationary. Thus, the exposure time is longer than with a continuous transport system, and as such, a lower intensity source can be used. Also, the dimensions of the baffle can be altered so as to expose a border directly on the image area, and as such, a bordered image can be produced.

Having described the invention in detail and by reference to preferred embodiments thereof, it will be apparent that modifications and variations are possible without departing from the scope of the invention defined in the appended claims.

What is claimed is:

1. An apparatus for exposing and developing an imaging web having an image area and a border area, said imaging web including a support having a layer on the surface thereof of photosensitive microcapsules including an internal phase of a photohardenable photosensitive composition and a color former, comprising:
   a source of actinic radiation for uniform exposure of said border area of said imaging web to harden said photosensitive microcapsules;
   means for preventing said source of actinic radiation from exposing said image area of said imaging web; and
   pressure application developer means.

2. The apparatus of claim 1 wherein said source of actinic radiation provides actinic radiation selected from the group consisting of ultraviolet radiation, infrared radiation, visible light, X-ray, and ion beam irradiation.

3. The apparatus of claim 2 wherein said source of actinic radiation provides visible light.

4. The apparatus of claim 1 wherein said means for preventing said source of actinic radiation from exposing said image area of said imaging web comprises a receiver sheet positioned in contact with said image area.

5. The apparatus of claim 1 wherein said pressure application developer means is a pair of pressure rollers.

6. The apparatus of claim 1 wherein said means for preventing said source of actinic radiation from exposing said image area of said imaging web comprises a baffle having a U-shaped cross-section which is placed over said border area with its open end adjacent thereto and prevents said source of actinic radiation which is disposed within said baffle from exposing said image area.

7. An apparatus for exposing and developing an imaging web, said imaging web including a support having a layer on the surface thereof of photosensitive microcapsules including an internal phase of a photohardenable photosensitive composition and a color former, comprising:
   a first source of actinic radiation for image-wise exposure of said photosensitive microcapsules of said imaging web such that an image area is formed, said exposure defining a border area in said web comprising the areas of said imaging web surrounding said image area;

a second source of actinic radiation for uniform exposure of said border area of said imaging web to harden said microcapsules;

means for preventing said second source of actinic radiation from exposing said image area of said imaging web; and pressure application developer means.

8. The apparatus of claim 7 wherein said first and second sources of actinic radiation provide actinic radiation selected from the group consisting of ultraviolet radiation, infrared radiation, visible light, X-ray, and ion beam irradiation.

9. The apparatus of claim 8 wherein said first and second sources of actinic radiation provide visible light.

10. The apparatus of claim 7 wherein said means for preventing said second source of actinic radiation from exposing said image area of said imaging web comprises a baffle having a U-shaped cross-section which is placed over said border area with its open end adjacent thereto and prevents said second source of actinic radiation which is disposed within said baffle from exposing said image area of said imaging web.

11. The apparatus of claim 7 wherein said pressure application developer means is a pair of pressure rollers.

12. The apparatus of claim 7 wherein said means for preventing said second source of actinic radiation from exposing said image area of said imaging web comprises a receiver sheet positioned in contact with said image area.

* * * * *